United States Patent [19]
Yamaguchi

[11] 4,218,631
[45] Aug. 19, 1980

[54] ELECTRODE STRUCTURE FOR THICKNESS MODE PIEZOELECTRIC VIBRATING ELEMENTS

[75] Inventor: Kazumasa Yamaguchi, Machida, Japan

[73] Assignee: Kinsekisha Laboratory, Ltd., Komae, Japan

[21] Appl. No.: 910,532

[22] Filed: May 30, 1978

[30] Foreign Application Priority Data

Jun. 8, 1977 [JP] Japan .................................. 52-67631
Aug. 23, 1977 [JP] Japan ................................ 52-101206

[51] Int. Cl.$^2$ ............................................. H01L 41/10
[52] U.S. Cl. .................................. 310/312; 310/320; 310/365; 310/366
[58] Field of Search ............... 310/320, 312, 365, 366; 333/189-186, 191

[56] References Cited
U.S. PATENT DOCUMENTS

| | | | |
|---|---|---|---|
| 3,382,381 | 5/1968 | Horton | 310/365 X |
| 3,401,276 | 9/1968 | Curran | 310/320 |
| 3,760,471 | 9/1973 | Borner | 310/312 X |
| 3,898,489 | 8/1975 | Grady et al. | 310/366 |
| 4,013,982 | 3/1977 | Wood et al. | 333/72 |
| 4,066,986 | 1/1978 | Takano | 310/320 X |

FOREIGN PATENT DOCUMENTS 45-20226 2/1967 Japan .................................... 310/365

*Primary Examiner*—Mark O. Budd
*Attorney, Agent, or Firm*—Charles E. Pfund

[57] ABSTRACT

The vibrating element comprises a pair of exciting electrodes having opposing effective portions formed on the opposing major surfaces of a piezoelectric plate, and vibration adjusting members disposed on at least one of the exciting electrodes. The vibration adjusting members are made of the same material as the exciting electrodes and do not project beyond the contour of the effective portions in the direction of propagation of the vibration energy of the vibration but project in a direction perpendicular to the direction of propagation.

11 Claims, 10 Drawing Figures

ELECTRODE STRUCTURE FOR THICKNESS MODE PIEZOELECTRIC VIBRATING ELEMENTS

BACKGROUND OF THE INVENTION

This invention relates to a thickness vibration mode piezoelectric vibrating element. By the term thickness vibration mode is meant thickness shear, thickness twist and thickness extensional modes.

A double mode coupled quartz vibration element shown in FIG. 1 is old, for example U.S. Pat. No. 3,401,276. A crystal (quartz) plate 1 is produced by cutting a quartz crystal in parallel with the X-Z' plane of crystalline axes X, Y', and Z' in which axes Y' and Z' correspond to Y and Z' axes which are respectively rotated by a predetermined angle (for example 35°15' in the case of AT cut) about the X axis. Common exciting electrodes 2a and 2b are applied to one surface (front surface) of the crystal plate 1, and divided exciting electrodes 3 and 4 are applied to the opposite or rear surface. These electrodes are formed by vacuum deposition of such electroconductive metals as gold, silver and aluminum. Electrodes 2a and 3 and electrodes 2b and 4 oppose each other through the crystal plate 1. The common electrodes 2a and 2b are connected to a lead wire 6 via connecting electrodes 5a and 5b respectively, whereas the divided electrodes 3 and 4 are connected to lead wires 9 and 10 respectively through connecting electrodes 7 and 8.

Vibration adjusting members 11 and 12 are formed on the electrodes 2a and 2b for the proposed of adjusting the vibration frequency of the vibrating member as will be described later. The vibration adjusting members are prepared by vapor depositing the same material as said electrodes or magnesium fluoride ($MgF_2$).

Electrodes 2a, 2b, 3, 4, 5a, 5b, 7 and 8 are formed by primary vapor deposition, and at a stage of forming these electrodes, the vibration adjusting members 11 and 12, shown by shaded areas, are not yet deposited. These vibration adjusting members 11 and 12 are formed on the electrodes 2a and 2b by the following method. More particularly, the output level characteristic of the crystal plate subjected to the primary vapor deposition is measured by a measuring circuit shown in FIG. 2, which is usually used to measure the output of a piezoelectric vibrating element and comprises an oscillator 13, resistors 14 and 15 and a detector 16. The result of measurement is generally shown by a solid line curve a shown in FIG. 3. Since it is difficult to match the center frequency $f_{01}$ of the primary vapor deposited portions to a desired center frequency $f_0$ (for example 10.7 MHz) the center frequency $f_{01}$ is set to a value higher than the desired center frequency $f_0$ by a percentage of frequency variation of $10^{-4}$–$10^{-3}$. The vibration adjusting members 11 and 12 are provided for the purpose of causing the center frequency of $f_{01}$ of the crystal plate 1 obtained by the primary vapor deposition to approach the desired center frequency $f_0$ so that suitable amounts of the vibration adjusting members are formed on the electrodes 2a and 2b by secondary vapor deposition by using the result of measurement described above.

In this manner, a vibrating element having a desired center frequency can be obtained. However, the output level characteristic of the vibrating element deposited with the vibration adjusting members 11 and 12 changes from curve a to curve b shown in FIG. 3. In other words, curve b shows the characteristic obtainable when the center frequency is matched with that of the crystal plate subjected to the primary vapor deposition. Curve b shows that, at a frequency about 100KHz higher than the center frequency $f_0$, attenuation of about $-40$ dB caused by the primary vapor deposition decreases to about $-20$ dB whereby undesirable side resonance tends to occur.

Such undesirable side resonance caused by the secondary vapor deposition was also noted in a multi-mode coupled crystal vibrating element comprising more than three pairs of exciting electrodes, and a crystal vibrating element provided with a pair of exciting electrodes and more than two pairs of exciting electrodes which are not mode-coupled. However, any means has not been available which is effective to prevent such undesired side resonance.

SUMMARY OF THE INVENTION

Accordingly, it is an object of this invention to provide an improved thickness vibration type piezoelectric vibrating element capable of vibrating at a desired resonance frequency and suppressing undesired side resonance.

According to this invention there is provided a thickness vibration mode piezoelectric vibrating element of the type comprising a piezoelectric plate, a pair of exciting electrodes disposed on the opposed major surfaces of the piezoelectric plate and having opposed effective portions, vibration adjusting members respectively disposed on the exciting electrodes, and exciting means for exciting the pair of exciting electrodes for causing the piezoelectric plate to vibrate, characterized in that the vibration adjusting members do not project beyond the contour of the effective portions in a direction of propagation of the vibration energy of the vibration, and that the vibration adjusting members project in a direction perpendicular to the direction of propagation.

DESCRIPTION OF THE PREFERRED EMBODIMENT

Figure 1:
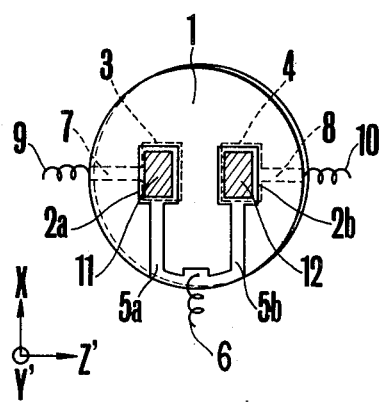
FIG. 1 is a plan view showing the arrangements of electrodes of a prior art double mode coupled crystal vibrating element.
Figure 4:
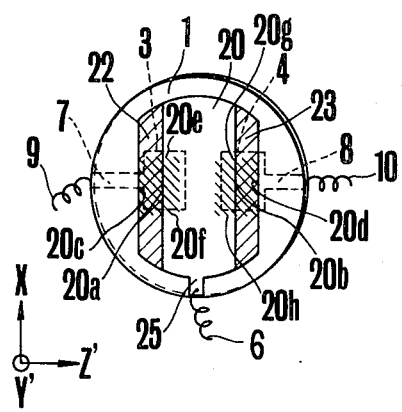
FIG. 4 shows the electrode arrangement of one example of a double mode coupled crystal vibrating element embodying the invention.

FIG. 4 shows one embodiment of a double mode coupled crystal vibrating element embodying the invention wherein elements corresponding to those shown in FIG. 1 are designated by the same reference characters.

Divided electrodes 3 and 4 and a common electrode 20 are formed by the primary vapor deposition on the opposite surfaces of a crystal (quartz) plate 1. As above described these electrodes are formed by vacuum depositing such vaporizable metals as gold, silver, aluminum or the like.

Where the common electrode 20 is used two pairs of exciting electrodes are formed by divided electrode 3 and a portion 20a of the common electrode 20, and by divided electrode 4 and a portion 20b of the common electrode 20, the portions 20a and 20b opposing the divided electrodes 3 and 4 through the crystal plate 1 thus acting as effective portions of the common electrode.

The main vibrations created by the two pairs of the exciting electrodes are mode-coupled with thickness and twist mode vibration to transmit the vibration energy in the direction of arrangement of the electrodes (in this example, in the direction of Z' axis) thus forming a so-called double mode coupled vibrating element.

The contour of the common electrode 20 is selected such that the side edges 20c and 20d of the effective portions 20a and 20b as seen in the direction of propagating the vibration energy do not project beyond the corresponding side edges of the crystal plate 1 whereas in the direction perpendicular to the direction of propagation (in this example, in the direction of X axis), the upper and lower sides of the common electrode 20 project beyond the sides 20e, 20f, 20g and 20h of the effective portions 20a and 20b to portions near the periphery of the crystal plate 1. Thus, as shown in FIG. 4 the common electrode 20 takes the form of an oval with both sides cut at a predetermined distance from the center. It was confirmed by experiment that if the electrode 20 projects beyond the sides 20c and 20d of the effective portion 20a and 20b towards the periphery of the crystal plate 1 side resonance would be resulted in the same manner as in a case where the adjusting member to be described later projects.

Figure 2:
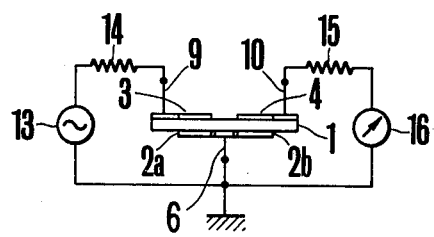
FIG. 2 shows a circuit for measuring the output level characteristic of a piezoelectric vibrating element.
Figure 5:
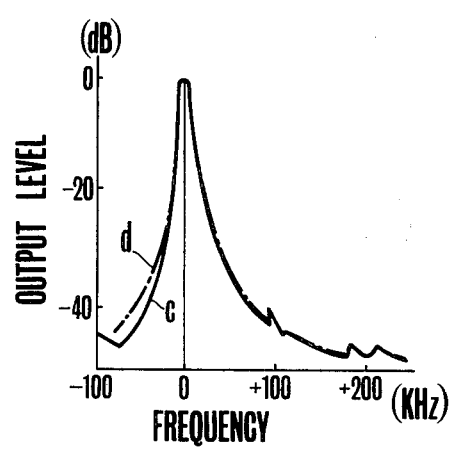
FIG. 5 is a graph showing the output level characteristic curves after primary and secondary vapor depositions in the double mode coupled crystal vibrating element shown in FIG. 4.
Figure 3:
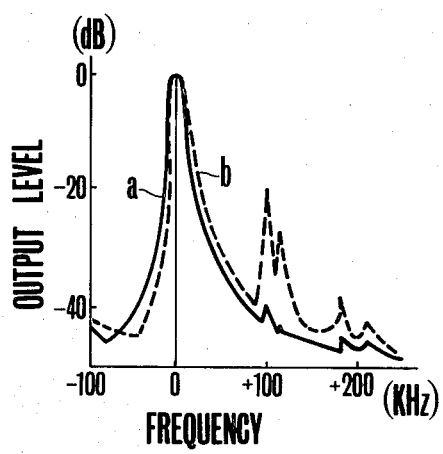
FIG. 3 is a graph showing the output level characteristic curves obtainable after primary and secondary vapor depositions in a prior art double mode coupled crystal vibrating element.

The output level characteristic after the primary vapor deposition was measured by the measuring circuit shown in FIG. 2 and the result is shown in FIG. 5. Like curve a shown in FIG. 3, curve c shown in FIG. 5 does not shown any undesirable side resonance. The resonance frequency $f_{01}$ obtained by the primary vapor deposition is higher by about 30 KHz than the desired resonance frequency $f_0$ (=10.7 MHz).

Then, in order to match the resonance frequency to the desired resonance frequency vibration adjusting members 22 and 23 are formed on the divided electrodes 3 and 4 or the common electrode 20 by effecting secondary vapor deposition of the same vaporizable metal as in the primary vapor desposition or $MgF_2$. For example A: is used for primary vapor deposition and Ag, Mgf$_2$ or SiO$_2$ is used for secondary vapor deposition. These vibration adjusting members 22 and 23 may be deposited on either one of the electrodes 3, 4 and 20. In the case shown in FIG. 4, the vibration adjusting electrodes are deposited in the form of rectangles which are in contact with the sides 20c and 20d of the effective portions 20a and 20b of the common electrode 20 and extending at right angles with respect to the direction of propagation of the vibration.

In the same manner as above described, the output level characteristic of the vibrating element after the secondary vapor deposition was measured and its result is shown by dash and dot lines d in FIG. 5 which shows substantially the same attenuation as curve c. Here it should be noted that the vibration adjusting members 22 and 23 do not project beyond the side edges 20c and 20d of the effective portions 20a and 20b toward the periphery of the crystal plate 1 in the direction of propagation. Should the vibration adjusting members 22 and 23 project beyond the side edges 20c and 20d, side resonance would be formed in the same manner as in the prior art construction as shown by curve b in FIG. 3. In FIG. 4, reference numeral 25 designates a connecting electrode or a lead wire.

Figure 6:
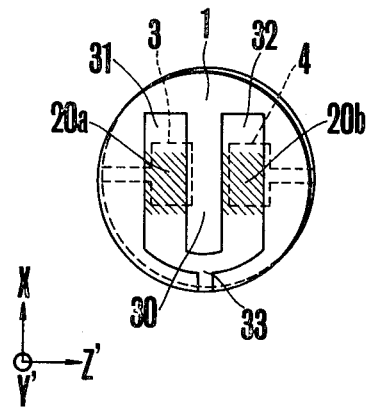
FIG. 6 shows the electrode arrangement of another embodiment of the double mode coupled crystal vibrating element according to this invention.

FIG. 6 shows a modified double mode coupled crystal vibrating element wherein the portion 30 of the common electrode 20 between electrode pairs 3–20a and 4–20b is removed to form common electrode legs 31 and 32 and the common electrode is connected to the periphery of the cystal plate 1 by a connecting electrode 33. Thus, the common electrode (31, 32 and 33) takes the form of U.

While curve d shown in FIG. 5 has a slightly lower attenuation at a frequency lower than the center frequency $f_0$, the attenuation of the output level characteristic of this modification is much smaller. In other word, the output level characteristic of this modification is substantially the same as curve c, in FIG. 3.

Figure 7:
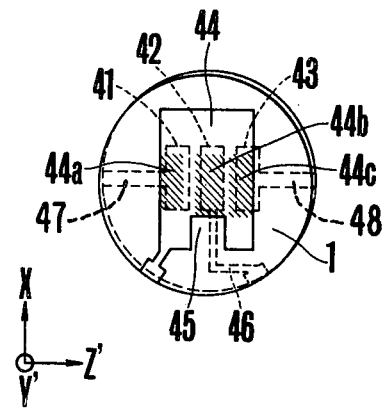
FIG. 7 shows the electrode arrangement of one example of a tripple mode coupled crystal vibrating element embodying the invention.

FIG. 7 shows a still further modification in which the invention is applied to triple mode coupled crystal vibrating element. In FIG. 7, 41 and 42 comprise an exciting electrode pair corresponding to the divided electrodes 3 and 4 shown in FIG. 4 and the common electrode 44 deposited on the other surface of the crystal plate 1 has the form of a rectangle with one side notched as at 45. The common electrode 44 is placed at substantially the center of the crystal plate 1. The shaded portions 44a, 44b and 44c of the common electrode 44 respectively oppose the divided electrodes 41–43 via the crystal plate 1 thus acting as effective portions that constitute the exciting electrode pairs.

The reason that the effective portion 44b of the common electrode 44 is disposed to oppose the notch 45 is to cause the effective portion not to oppose the connecting electrode 46 of the divided electrode 42. However, in this case too, since one side of the effective portion 44b projects in the direction of X axis, the object of this invention can also be attained. In this embodiment too, it is possible to divide the common electrode as shown in FIG. 6. In FIG. 7, reference numerals 47 and 48 designate the lead wires for the divided electrodes 41 and 43.

Figure 8:
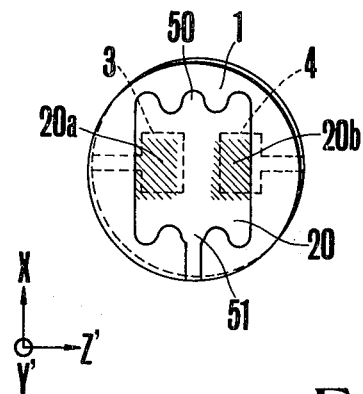
FIG. 8 shows the electrode arrangement of another embodiment of a double mode coupled crystal vibrating element provided with wavy portions.

FIG. 8 shows still another embodiment of the double mode coupled crystal vibrating element of this invention in which the opposite sides of the common electrode 20 shown in FIG. 4 which extend in a direction perpendicular to the direction of propagation of the oscillation energy are provided with wavy portions 50 and 51 for suppressing such other undesirable mode vibrations as a bending mode vibration more than the desired thickness twist mode vibration. This construction is advantageous especially when it is necessary to excite at a frequency band of from several hundred KHz to several MHz which is the lower limit of the resonance frequency in the case of a thickness shear mode vibration. Instead of providing the wavy portion on both sides it may be provided for either one of the upper and lower sides.

The wavy portions 50 and 51 may provide not only for the double mode coupled crystal vibrating element but also for the triple mode coupled type. Further, such wavy portions can also be provided for vibrating elements having a pair of exciting electrodes or two or more not-mode-coupled electrode pairs to be described later.

Figure 9:
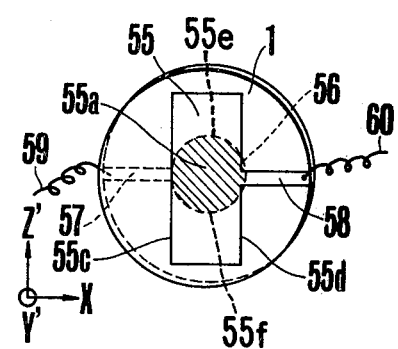
FIG. 9 shows the electrode arrangement of one example of a thickness shear mode crystal vibrating element embodying the invention and provided with a pair of exciting electrodes.

FIG. 9 shows a modified embodiment of a thickness mode crystal vibrating element comprising a pair of exciting electrodes 55 and 56. In this embodiment, the thickness shear mode vibration (main vibration) propagates in the direction of X axis, and the exciting electrode 55 extends beyond the side edge 55e and 55f of the effective portion 55a which oppose the circular electrode 56 in a direction (the direction of Z' axis) perpendicular to the direction of propagation towards portions near the periphery of the crystal plate 1. In this embodiment too, the sides 55c and 55d of the exciting electrode 55 which are perpendicular to the direction of propagation do not project beyond the effective portion 55a in the direction of propagation. In other words exciting electrode 55 has two sides intersecting with the direction of propagation at right angles and in contact with the sides of the effective portion 55a. In FIG. 9, reference numerals 57 and 58 show the leads of electrodes 55 and 56 respectively, and 59 and 60 lead wires.

In a case wherein a pair of exciting electrodes are used it is possible to suppress undesired side resonance by constructing the electrode 55 to have a shape as shown in FIG. 9.

Figure 10:
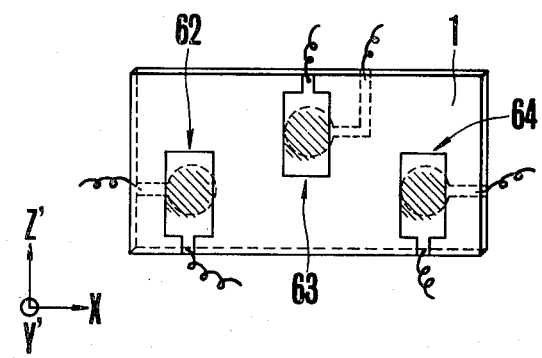
FIG. 10 shows the electrode arrangement of one example of a thickness shear mode crystal vibrating element embodying the invention and utilizing three pairs of independent exiting electrodes which are not mode coupled to each other.

FIG. 10 shows one example of a thickness mode coupled crystal vibrating element in which three pairs of independent exciting electrodes 62, 63 and 64 which are not mode coupled are formed on a relatively larger crystal (quartz) plate 1. The construction of each pair of exciting electrodes, their leads and lead wires are the same as those shown in FIG. 9.

Although in connection with the embodiments shown in FIGS. 6 through 10 nothing was mentioned about the adjusting members, it should be understood that such adjusting members are deposited on respective electrodes or on any portions within a range not projecting beyond the periphery of the effective portion in a direction of propagation towards the periphery of the crystal plate.

In the foregoing embodiments all portions formed on the crystal plate 1 by the primary vapor deposition were referred to as electrodes. Actually, however, the portions of the electrodes that contribute to the vibration of the crystal plate are only the effective portions so that it is possible to deem portions projecting beyond the effective portions as the vibration adjusting portions.

Briefly stated, the invention is characterized in that the vibration adjusting members formed on the effective portions of opposing exciting electrode pairs disposed on the opposite surfaces of a crystal plate do not project beyond the periphery of the effective portions in towards the periphery of the crystal plate in a direction of propagation of the vibration energy and that the exciting electrodes project beyond the effective portions in a direction perpendicular to the direction of propagation of the vibration towards the periphery of the crystal plate.

It should be understood that the invention is never limited to specific embodiments described above and that many changes and modifications may be made within the scope of the invention.

For example, the piezoelectric plates shown in all embodiments were assumed as a AT cut quartz plate for the sake of description it is also possible to use quartz plates of BT cut, FC cut or RT cut or piezoelectric plates made of other piezoelectric substances, for example, lithium tentalate, lithium neobate or piezoelectric ceramics.

Instead of vacuum deposition technique, the electrodes can also be formed by other techniques, for example chemical plating, sputtering or the like as above described according to this invention, by specifying the contour of the vibration adjusting members with respect to the effective portions of the electrode pair it is possible to prevent decrease in the attenuation, and to suppress unwanted side resonance thus readily matching the frequency of vibration to the desired frequency.

Moreover, as the exciting electrodes of this invention can be prepared by the conventional method without using any special step.

What is claimed is:

1. In a thickness vibration mode piezoelectric vibrating element comprising a piezoelectric plate, a pair of exciting electrodes, of which one electrode is arranged on one major surface of said piezoelectric plate to oppose the other that is arranged on the other major surface of said piezoelectric plate so as to create an effective portion therebetween, and a vibration adjusting member for adjusting vibration frequency which is disposed on either one of said pair of exciting electrodes, the improvement wherein said vibration adjusting member overlaps said effective portion and is formed to extend within the peripheral boundary of said effective portion of said exciting electrode along the propagation line of the vibration energy caused by said pair of exciting electrodes while said vibration adjusting member extends beyond the peripheral boundary of said effective portion of said exciting electrode in the directions perpendicular to the propagation line towards the periphery of said piezoelectric plate.

2. A thickness vibration mode piezoelectric vibrating element according to claim 1 which comprises two or more pairs of exciting electrodes wherein the vibration energy of the main vibration excited by one pair of exciting electrodes is independent of the vibration energy of the main vibration excited by an adjacent pair of exciting electrodes.

3. A thickness vibration mode piezoelectric vibrating element according to claim 1, which comprises two or more pairs of exciting electrodes wherein the vibration energy of the main vibration excited by one pair of exciting electrodes is mode-coupled with the vibration energy of the main vibration excited by an adjacent pair of exciting electrodes.

4. A thickness vibration mode piezoelectric vibrating element according to claim 1 which comprises two or more pairs of exciting electrodes wherein the vibration energy of the main vibration excited by one pair of exciting electrodes is independent of the vibration energy of the main vibration excited by an adjacent pair of exciting electrodes.

5. A thickness vibration mode piezoelectric vibrating element according to claim 1 wherein said piezoelectric plate comprises a quartz plate parallel with the X-Z' axes plane of the crystalline axes (X, Y', Z') of quartz, wherein the vibration energy of the main vibration propagates in the direction of X axis, said Z' axis is a direction perpendicular to the propagation line of the vibration energy.

6. In a thickness vibration mode piezoelectric vibration element comprising a piezoelectric plate, two or more pairs of exciting electrodes constituted such that each pair is formed with one electrode on one major surface of the said piezoelectric plate and the other electrode on the other major surface of said plate to have them opposed to each other and to create an effective portion therebetween so that neighboring pairs are coupled with each other through vibration energy, and a vibration adjusting member for adjusting the vibration frequency which is disposed on either one of said pair of exciting electrodes, the improvement wherein said vibration adjusting member overlaps said effective portion and is formed to extend within the peripheral boundary of said effective portion of said exciting electrode along the propagation line of the vibration energy caused by said pair of exciting electrodes while said vibration adjusting member extends beyond the peripheral boundary of said effective portion in the directions of said exciting electrode perpendicular to the propagation line towards the periphery of said piezoelectric plate.

7. A thickness vibration mode piezoelectric vibrating element according to claim 6 wherein said piezoelectric plate comprises a quartz plate parallel with the X-Z' axes plane of the crystalline axes (X, Y', Z') of quartz, wherein the vibration energy of the main vibration propagates in the direction of Z' axis which is perpendicular to the X axis.

8. A thickness vibration mode piezoelectric vibrating element according to claim 6 wherein said piezoelectric plate comprises a quartz plate parallel with the X-Z' axes plane of the crystalline axes (X, Y', Z') of quartz, wherein the vibration energy of the main vibration propagates in the direction of Z' axis which is perpendicular to the X axis.

9. In a thickness vibration mode piezoelectric vibrating element comprising a piezoelectric plate, two or more pairs of exciting electrodes disposed on the opposed major surfaces of said piezoelectric plate and having opposed effective portions, vibration adjusting members respectively disposed on exciting electrodes on one of said opposed major surfaces, and means for exciting a pair of exciting electrodes for causing said piezoelectric plate to vibrate wherein the vibration energy of the main vibration excited by one pair of exciting electrodes is mode coupled with the vibration energy of the main vibration excited by an adjacent pair of exciting electrodes, the improvement wherein the vibration adjusting members overlap said effective portions but otherwise do not project beyond the outer contour of said effective portions in a direction of propagation of the vibration energy of vibration, and wherein the vibration adjusting members extend beyond the contour of said effective portions in a direction perpendicular to said direction of propagation.

10. A thickness vibration mode piezoelectric vibrating element according to claim 9 wherein said vibration adjusting members are made of the same material as the exciting electrodes and constitute the same.

11. A thickness vibration mode piezoelectric vibrating element according to claim 9 wherein said vibration adjusting members comprise vapor deposited insulator.

* * * * *

UNITED STATES PATENT AND TRADEMARK OFFICE
CERTIFICATE OF CORRECTION

PATENT NO. : 4,218,631
DATED : Aug. 19, 1980
INVENTOR(S) : Kazumasa Yamaguchi

It is certified that error appears in the above—identified patent and that said Letters Patent is hereby corrected as shown below:

col. 3, line 31: delete "and"

col. 4, line 30: change "cystal" to --crystal--

Signed and Sealed this

Eighth Day of December 1981

[SEAL]

Attest:

GERALD J. MOSSINGHOFF

Attesting Officer     Commissioner of Patents and Trademarks